US006934925B2

(12) United States Patent
Nonaka

(10) Patent No.: US 6,934,925 B2
(45) Date of Patent: Aug. 23, 2005

(54) METHOD FOR DESIGNING SEMICONDUCTOR CIRCUIT

(75) Inventor: Nobuaki Nonaka, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 236 days.

(21) Appl. No.: 10/437,952

(22) Filed: May 15, 2003

(65) Prior Publication Data

US 2003/0217348 A1 Nov. 20, 2003

(30) Foreign Application Priority Data

May 17, 2002 (JP) ........................................ 2002-142923

(51) Int. Cl.[7] .............................................. G06F 17/50
(52) U.S. Cl. .............................. 716/14; 716/6; 716/9; 716/10; 716/13; 716/17
(58) Field of Search ........................... 716/6, 9, 10, 13, 716/14, 17

(56) References Cited

U.S. PATENT DOCUMENTS

| 5,378,904 | A | * | 1/1995 | Suzuki et al. ................ 257/208 |
| 6,629,300 | B1 | * | 9/2003 | Otake ............................. 716/8 |
| 2002/0010901 | A1 | * | 1/2002 | Otaguro ........................ 716/12 |

OTHER PUBLICATIONS

NN85057188, "One–Dimensional Transistor Arrays for Logic Circuits With Fixed Incidence Structure", IBM Technical Disclosure Bulletin, May 1985, vol. 27, No. 12, pp. 7188–7192 (6 pages).*
Zhou et al., "Simultaneous routing and buffer insertion with restrictions on buffer locations", 36th Proceddings of Design Automation Conference, Jun. 21, 1999, pp. 96–99.*
Venkatesan et al., "Optimal n–tier multilevel interconnect architectures for gigascale integration (GSI)", IEEE Transactions on Very Large Scale Integration (VLSI) Systems, vol. 9, No. 6, Dec. 2001, pp. 899–912.*
Zhou et al., "Simultaneous routing and buffer insertion with restrictions on buffer locations", IEEE Transactions on Computer–Aided Design of Integrated Circuits and Systems, vol. 19, No. 7, pp. 819–824.*
Yoshikawa et al., "Optical interconnection as an IP macro of a CMOS library", Hot Interconnects 9, Aug. 22, 2001, pp. 31–35.*
Venkatesan et al., "Optimal repeater insertion for n–tier multilevel interconnect architectures", Proceedings of the IEEE 2000 International Interconnect Technology Conference, Jun. 5, 2000, pp. 132–134.*
Venkatesan et al., "Minimum power and area n–tier multilevel interconnect architectures using optimal repeater insertion", Proceedings of the 2000 International Symposium on Low Power Electronics and Design, Jul. 26, 2000, pp. 167–172.*

* cited by examiner

Primary Examiner—Matthew Smith
Assistant Examiner—Phallaka Kik
(74) Attorney, Agent, or Firm—Arent Fox PLLC

(57) ABSTRACT

This invention provides a method for designing a semiconductor circuit which comprises a macro design step for designing plural macros in which plural cells are internally connected and a whole circuit design step for configuring plural macros and designing external wirings. The macro design step secures beforehand internal wiring prohibiting regions which enable to wire external wirings vertically and horizontally across the macro, and buffer allocable regions which allocate buffers as repeaters for the external wirings. The whole circuit design step enables to wire external wirings across the macro by passing through the internal wiring prohibiting regions of the macro and to configure the buffers as repeaters which are connected with the external wirings inside the buffer allocable regions of the macro.

20 Claims, 9 Drawing Sheets

F I G. 6
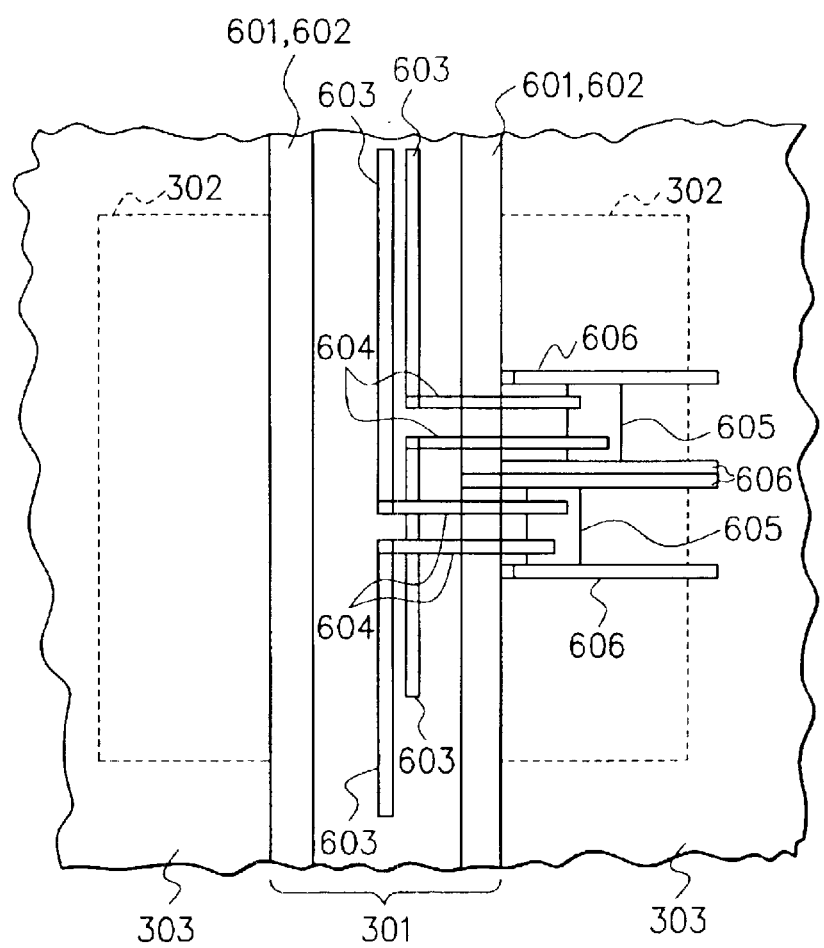

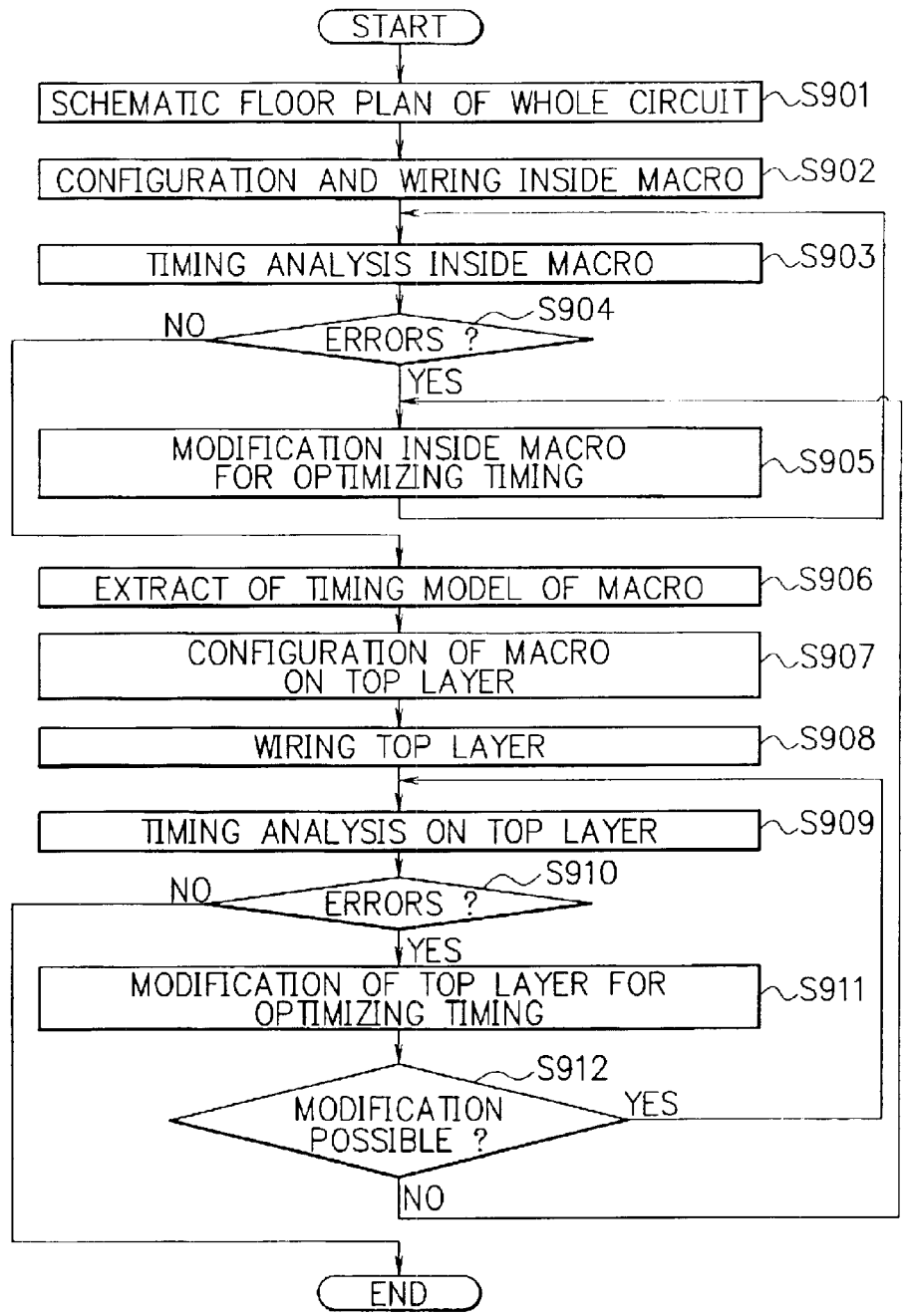

F I G. 10A
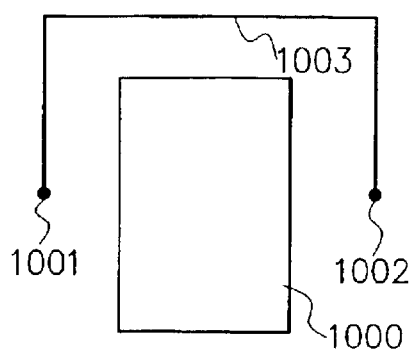
F I G. 10B
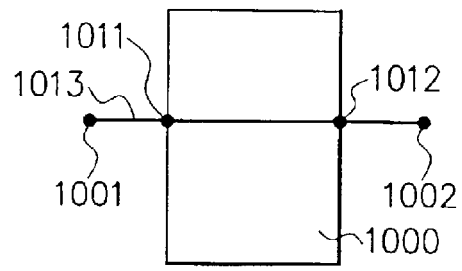
F I G. 10C
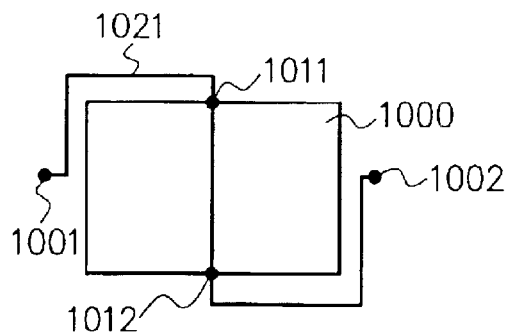

METHOD FOR DESIGNING SEMICONDUCTOR CIRCUIT

CROSS-REFERENCE TO RELATED APPLICATIONS

This application is based upon and claims the benefit of priority from the prior Japanese Patent Application No. 2002-142923, filed on May 17, 2002, the entire contents of which are incorporated herein by reference.

BACKGROUND OF THE INVENTION

1. Field of the Invention

This invention relates to a method for designing a semiconductor circuit and, more specifically, for carrying out a macro design at first and completing a whole circuit design after that.

2. Description of the Related Art

FIG. 9 is a flow chart to show procedures in a method for designing a semiconductor circuit based on a prior art. First, a schematic floor plan of a whole circuit is executed in a step S901. This means a schematic configuration of plural macros in the whole circuit is outlined in this step. Next, the macros are designed in a step S902. To be more precise, cells inside the plural macros and wiring are designed. After that, timing inside each macro is analyzed in a step S903. Then, presence of a timing error is checked in a step S904. If there is any timing error, a step S905 is executed. If not, a step S906 is executed.

The macro design is modified for optimizing timing in a step S905. After that, the procedure is repeated by returning to the step S903. When the timing error disappears, the step S906 is executed.

A timing model of each macro is extracted in this step S906. To be more precise, a timing model such as a response time or the like of input/output when reviewing the macro from the outside, is extracted. Next, a whole circuit is planned in steps S907 and S908. To be more precise, each macro is configured on a top layer in the step S907, and the whole circuit on the top layer is wired in the step S908. Then, a timing of the whole circuit on the top layer is analyzed in a step S909. After that, presence of a timing error is checked in a step S910. If there is, a step S911 is executed. If not, the design is completed.

The whole circuit design is modified for optimizing timing in the step S911. The possibility of modification is examined in a step S912. If possible, timing of the whole circuit after modification is analyzed by returning to the step S909. If impossible, the design inside the macro is modified by returning to the step S905. This means if a timing error is not completely modified by just modifying the whole circuit design, returning to the macro design procedure is inevitable. These procedures must be repeated until timing errors of both macros and the whole circuit completely disappear.

This method for designing the semiconductor circuit comprises a procedure for returning to the step S903 due to an error found in the step S904, and a procedure for returning to the steps S909 and S905 due to an error found in the step S910. Especially, the one for returning to the step S905 due to the error found in the step S910 greatly influences entire design time.

In a development of the latest LSI (Large Scale Integration), timing margin decreases according to the rise of operating frequency. Therefore, an ideal optimization for satisfying all conditions is getting more and more difficult. As a result, the number of procedures for returning to a previous one has increased and time for designing has multiplied.

For example, when a timing error happens due to signal delay of a long external wiring which surrounds a large macro, returning to the step S905 is required due to the error found in the step S910. A typical example will hereunder be described, in which a timing error after timing analysis of a whole circuit on a top layer is found.

FIG. 10A is a view to show a wiring of the whole circuit on the top layer wired in the above-described step S908. An external wiring 1003 is a wiring for connecting nodes 1001 with 1002, and it surrounds a macro 1000. If a timing error is found in the step S910, the wiring length of the external wiring 1003 must be shortened. However, if it cannot be shorter than the present one, it is concluded at the step S912 that modification is impossible. Therefore, returning to step S905 is required.

As can be seen in FIG. 10B, by modifying the macro design in the step S905, external terminals 1011 and 1012 are then provided in the macro 1000, and an internal wiring for connecting them is also provided. The external wirings 1013 are wired in the step S908. The external wirings 1013 connect the nodes 1001 and 1002 via the external terminals 1011 and 1012. Then, a timing error disappears due to shorter length of the wirings between the nodes 1001 and 1002 and shorter delay time. However, even if this timing error is eliminated at the step S910, another timing error may happen in another portion of the whole circuit due to the above-described design modification.

As can be seen in FIG. 10C, the macro 1000 must be often rotated by 90° in the step S911. In this case, longer external wirings 1021 which connect the nodes 1001 and 1002 are required, and delay time also becomes longer. A procedure for returning to the step S905 must be performed due to an error found in the step S910.

Modification of a portion which does not satisfy conditions due to a timing error influences another portion and requires adjustment of timing again. Repetition of such procedures aggravates convergence of the design. In the case that the same type of plural macros are configured on a top layer, when configuration and wiring inside the macro is modified for eliminating a timing error of a whole circuit on the top layer, this macro is required to be handled as another.

SUMMARY OF THE INVENTION

An object of this invention is to shorten design time by excluding a procedure for returning to a macro design when modification of whole circuit design due to a timing error is found impossible.

This invention provides a method for designing a semiconductor circuit which comprises a macro design step for designing plural macros in which plural cells are internally connected and a whole circuit design step for configuring plural macros and designing external wirings. The macro design step secures beforehand internal wiring prohibiting regions which enable to wire external wirings vertically and horizontally across the macro, and buffer allocable regions which allocate buffers as repeaters for the external wirings. The whole circuit design step enables to wire external wirings across the macro by passing through the internal wiring prohibiting regions of the macro and to configure the buffers as repeaters which are connected with the external wirings inside the buffer allocable regions of the macro.

Because the macro design is designed by securing internal wiring prohibiting regions and buffer allocable regions beforehand, the external wirings can be wired by passing through the internal wiring prohibiting regions of the macro in the whole circuit design procedure. Furthermore, the buffers can be configured as repeaters for connecting with the external wirings. It excludes a procedure for returning to the macro design when modification of a whole circuit design is found impossible, which shortens design time.

BRIEF DESCRIPTION OF THE DRAWINGS

FIG. 6 is a surface view of the macro to show an example of an external wiring provided inside an internal wiring prohibiting region;

FIG. 9 is a flow chart to show procedures in a method for designing a semiconductor circuit based on a prior art; and FIG. 10A to FIG. 10C are views showing macros and external wirings.

DETAILED DESCRIPTION OF THE PREFERRED EMBODIMENTS

Figure 2:
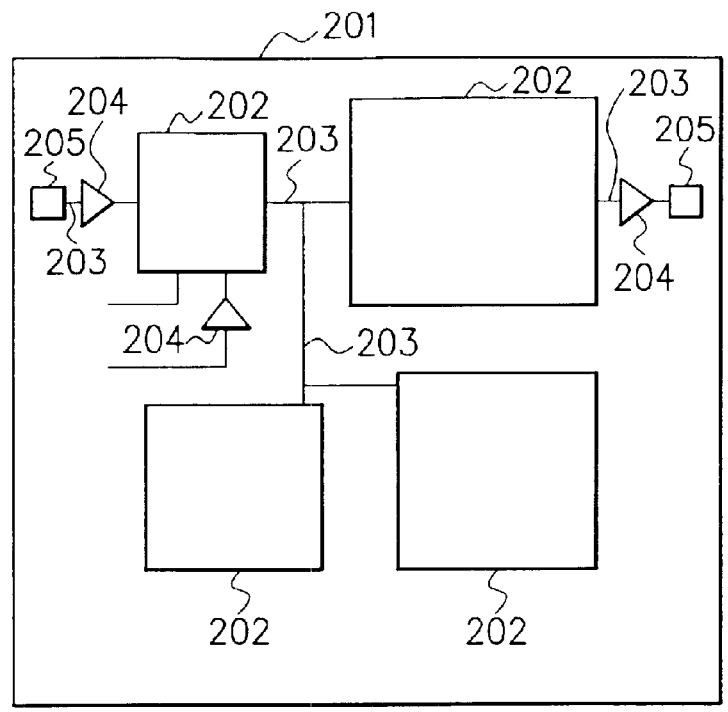
FIG. 2 is a schematic diagram of an example of the semiconductor circuit such as LSI or the like which is intended for CAD in the preferred embodiment of this invention.

FIG. 2 shows an example of a semiconductor circuit 201 such as LSI and the like, which is intended for CAD (computer-aided design) according to a preferred embodiment of this invention. The semiconductor circuit 201 comprises plural macros 202, external wirings 203, external terminals (bonding pads) 205 and buffers 204. Plural cells are internally connected inside each macro 202. A design method of the semiconductor circuit 201 will be described hereinafter.

Figure 3:
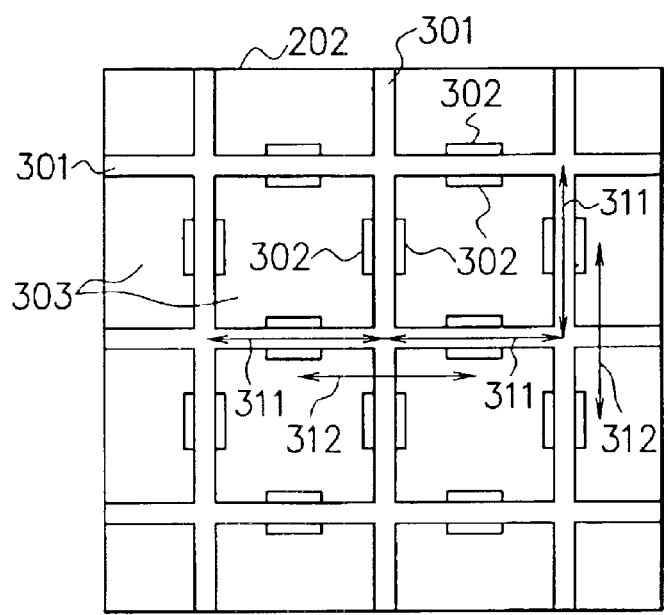
FIG. 3 is a diagrammatic view showing a macro design.

FIG. 3 is a diagrammatic view to show the macro 202 designed in a macro design. The macro 202 comprises internal wiring prohibiting regions 301 and buffer allocable regions 302. The internal wiring prohibiting regions 301 are netty prohibiting regions of internal wirings, which enables to wire external wirings vertically and horizontally across the macro. The buffer allocable regions 302 are regions for allocating buffers as repeaters for the above-described external wirings. They are provided along both sides of the internal wiring prohibiting regions 301. Internal wiring feasible regions 303 are wiring regions for connecting with cells and terminals inside the macros. The semiconductor circuit 201 comprises e.g., six wiring layers. The internal wiring prohibiting regions 301 are provided only on the fifth and sixth wiring layers, and internal wirings are allowed on all other layers.

The buffer allocable regions 302 are provided at middle portions of intervals 311 between intersections of the vertical internal wiring prohibiting regions 301 and the horizontal ones 301. Intervals 312 between the buffer allocable regions 302 are the same as the intervals 311 between the intersections of the internal wiring prohibiting regions 301.

Figure 4:
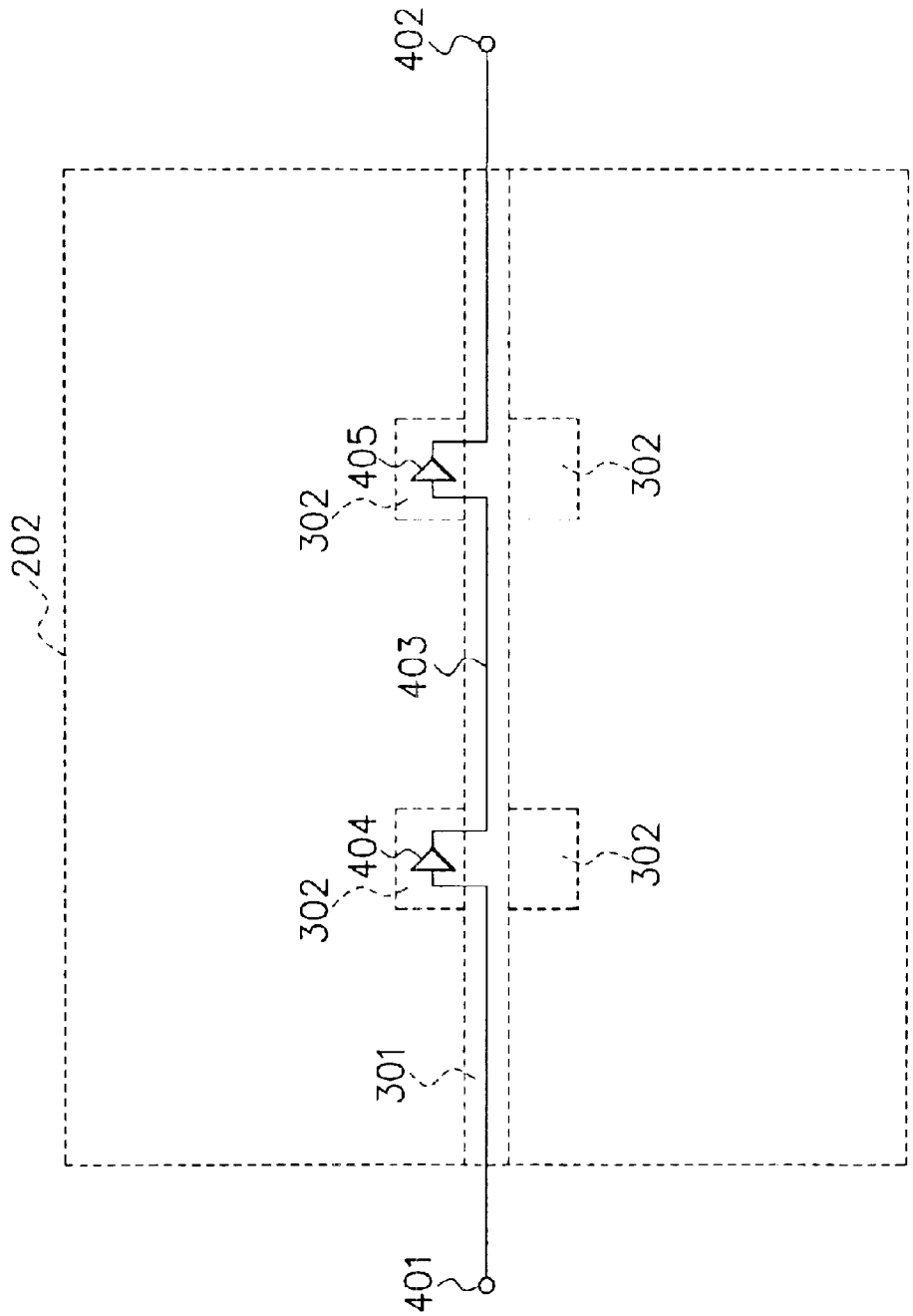
FIG. 4 is a view showing an external wiring wired in a whole circuit design.

FIG. 4 shows an external wiring wired in a whole circuit design. A whole circuit design for configuring plural macros and designing the external wirings is conducted after the above-described macro design. The internal wiring prohibiting region 301 and the buffer allocable regions 302 are secured beforehand inside the macro 202. An external wiring 403 is wired for connecting the nodes 401 and 402. The external wiring 403 crosses the macro 202 by passing through the internal wiring prohibiting region 301 inside the macro 202. Buffers 404 and 405 are provided in the buffer allocable regions 302 inside the macro 202, and each of them function as a repeater connected with the external wiring 403. Cells and the buffers 404 and 405 inside the macro 202 are connected with a same power source line. A function of the buffers 404 and 405 will be explained hereunder.

Figure 5:
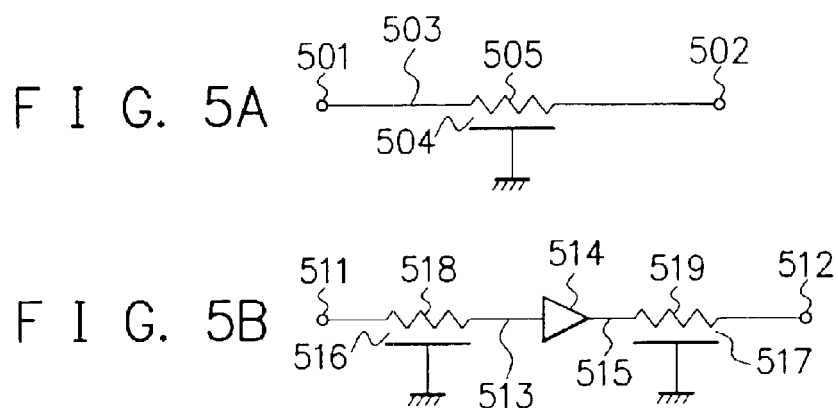
FIG. 5A is a view showing a wiring connected between nodes without a buffer.
FIG. 5B is a view showing a wiring connected between nodes via a buffer.

FIG. 5A shows a wiring 503 which connects between nodes 501 and 502 without a buffer. A wiring capacity 504 and a wiring resistance 505 exist in the wiring 503. The larger the wiring capacity 504 and the wiring resistance 505 are, the longer the wiring 503 is. Delay time between the nodes 501 and 502 is proportional to a product of the wiring capacity 504 and the wiring resistance 505. Therefore, the larger the wiring capacity 504 and the wiring resistance 505 are, the slower the delay time between the nodes 501 and 502 is.

FIG. 5B shows wirings 513 and 515 which connect between nodes 511 and 512 via a buffer 514. The wiring 513 is connected between the node 511 and an input terminal of the buffer 514. The wiring 515 is connected between an output terminal of the buffer 514 and the node 512. A wiring capacity 516 and a wiring resistance 518 exist in the wiring 513. A wiring capacity 517 and a wiring resistance 519 exist in the wiring 515. However, the wirings 513 and 515 are half the length of the wiring 503 shown in FIG. 5A. Accordingly, each of the wiring capacities 516 and 517 is half of the capacity of the wiring capacity 504 shown in FIG. 5A. As a result, delay time between the nodes 511 and 512 is half of the delay time between the nodes 501 and 502 shown in FIG. 5A.

Figure 1:
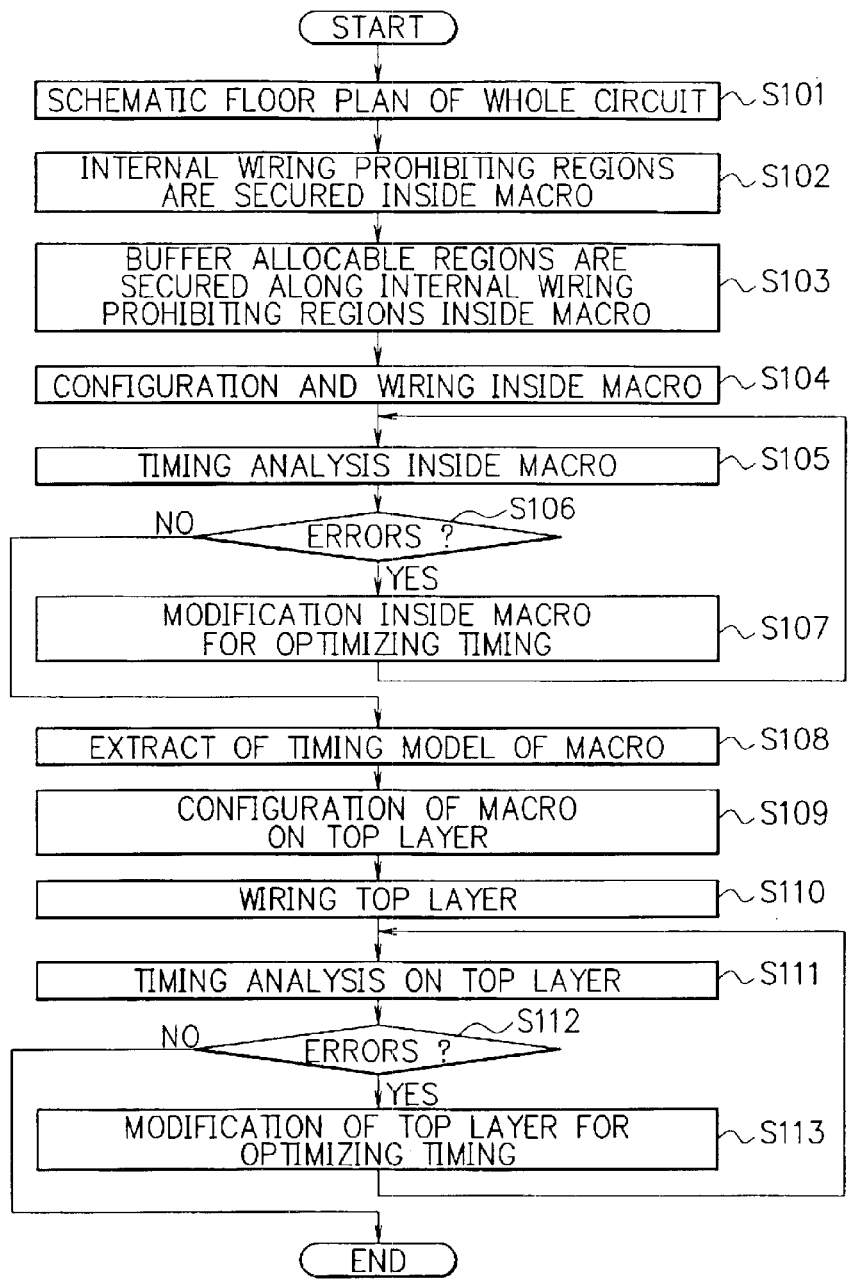
FIG. 1 is a flow chart showing procedures in a method for designing a semiconductor circuit of a preferred embodiment of this invention.

FIG. 1 is a flow chart to show procedures in a method for designing a semiconductor circuit of this preferred embodiment. In a step S101, a schematic floor plan of a whole circuit is executed. This means a schematic configuration of plural macros in the semiconductor circuit (whole circuit) 201 is outlined in this step. Macros for internally connecting with plural cells are designed in steps from S102 to S104. First, in a step S102, internal wiring prohibiting regions 301 through which external wirings of a top layer can pass are secured within the macro 202. In a step S103, the buffer allocable regions 302 along the internal wiring prohibiting regions 301 are secured within the macro 202. Next, in a step S104, designing for cells inside the plural macros 202 and wiring are conducted. After that, in a step S105, timing inside each macro is analyzed. In a step S106, presence of a timing error is checked. If there is, a step S107 is executed. If not, a step S108 is executed.

The macro design is modified for optimizing timing in a step S107. The procedure is then repeated after returning to the step S105. If a timing error disappears, the procedure progresses to a next step S108.

A timing model of each macro 202 is extracted in a step S108. To be more precise, a timing model such as a response time or the like of input/output when reviewing the macro from the outside is extracted. A whole circuit design is planned in steps S109 and S110. To be more precise, each macro 202 is configured on a top layer in the step S109, and the wirings 203 of the whole circuit are arranged on the top layer in the step S110. Then, a timing of the whole circuit 201 on the top layer is analyzed in a step S111. After that, presence of a timing error is checked in a step S112. If there is, a step S113 is executed. If not, design is completed.

The whole circuit design is modified for optimizing timing in the step S113, and a procedure is repeated after returning to the step S111. If a timing error disappears, design is completed.

When any error is found due to timing analysis of the whole circuit 201 in the step S111, the external wiring 403 is wired so that it passes through the internal wiring prohibiting region 301 inside the macro 202 in the step S113. The buffers 404 and 405 can be configured in the buffer allocable regions 302 inside the macro 202.

Wiring of the external wiring 403 and configuration of the buffers 404 and 405 may be modified in the step S113 for modification, when a timing error of the whole circuit 201 is found. Modification in wiring step of the whole circuit 201 in the step S110 is also acceptable.

In the case of the design method already shown in FIG. 9, when a timing error of a whole circuit is found in the step S910, and when modification of the whole circuit design is found impossible in step the S912, a procedure must be returned to the macro design by returning to the step S905, which requires a long time for design.

According to the preferred embodiment, the macro design is carried out with securing beforehand the internal wiring prohibiting regions 301 and the buffer allocable regions 302. Then, the external wirings can be conducted by passing through the internal wiring prohibiting regions 301 inside the macro through the whole circuit design. The buffers are also configured as repeaters connecting with the external wirings. Since external wirings passing the macro can be provided through the whole circuit design, a procedure for returning to the macro design in order to modify the whole circuit design can be excluded, which shortens design time.

Figure 7:
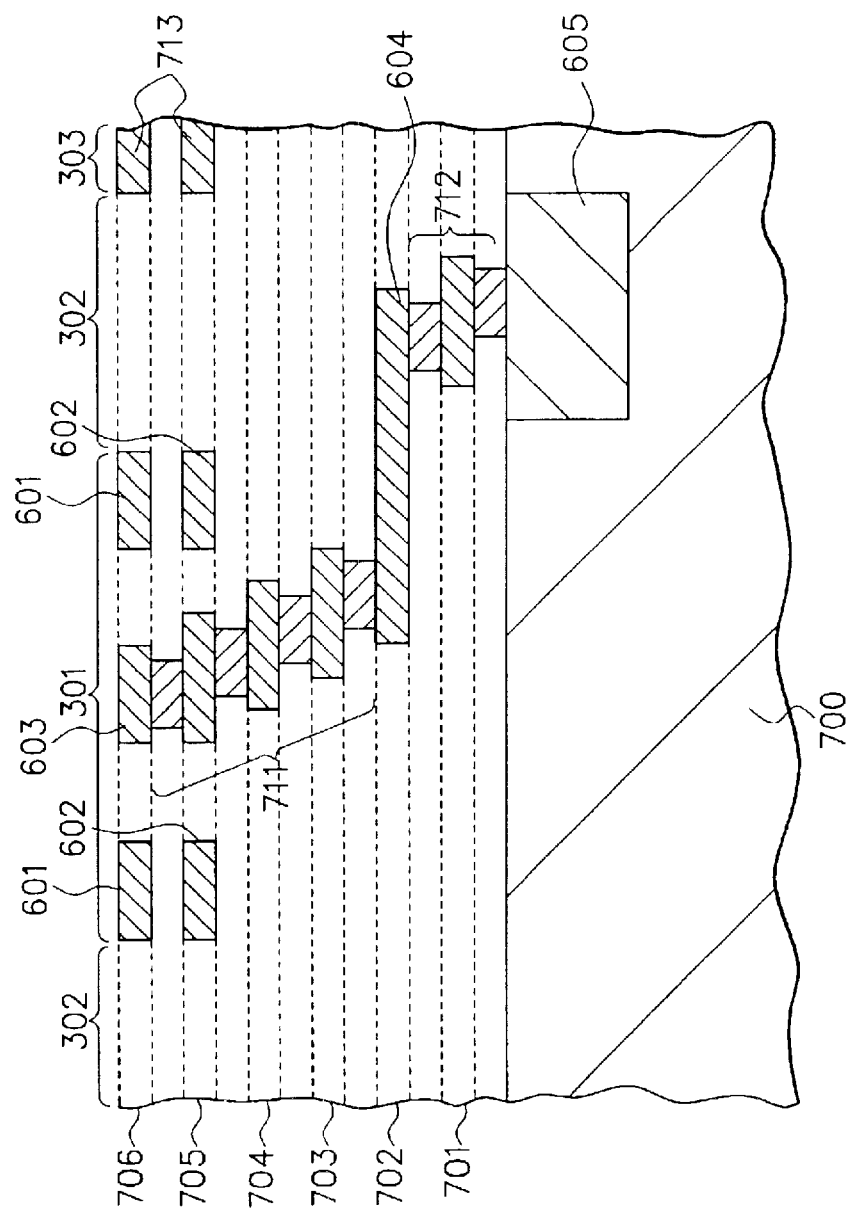
FIG. 7 is a cross-sectional view of the macro shown in FIG. 6.

FIG. 6 is a surface view of the macro in which an example of the external wirings provided in the internal wiring prohibiting regions 301 shown in FIG. 3, and FIG. 7 is a cross sectional view of the same. As shown in FIG. 7, the semiconductor 201 comprises a first wiring layer 701, a second wiring layer 702, a third wiring layer 703, a fourth wiring layer 704, a fifth wiring layer 705 and a sixth wiring layer 706 on a semiconductor substrate 700. An insulating layer is provided between each wiring layer (conductive layer) 701 through 706. The internal wiring prohibiting regions 301 are provided only on the fifth wiring layer 705 and the sixth wiring layer 706.

External wirings 603 are provided inside the internal wiring prohibiting regions 301. Buffer connecting wirings 604 are provided in e.g., the second wiring layer 702. The external wirings 603 and the buffer connecting wirings 604 are connected with each other via stacked via holes (contact holes) 711 between them. Buffers 605 are provided within a semiconductor wafer 700. The buffer connecting wirings 604 are connected with the buffers 605 via the wirings 712.

Internal wirings 713 are provided within the internal wiring feasible regions 303. External wirings 603 can be wired within the internal wiring prohibiting regions 301. Buffers 605 and wirings 712 connecting them are provided inside the buffer allocable regions 302.

In the case of the whole circuit design, power source lines 601 and ground lines 602 are provided as shield lines for shielding between the external wirings 603 which pass through the macro and the internal wirings 713 inside the macro. These shield lines can avoid cross talk. The power source lines 601 and the ground lines 602 are provided along both sides of the external wirings 603 inside the internal wiring prohibiting regions 301. The power source lines 601 are provided on the sixth wiring layer 706, and the ground lines are provided on the fifth wiring layer 705. The power source lines 601 and the ground lines 602 are wired in a parallel state in the different wiring layers 705 and 706 of the semiconductor circuit 201, and they are connected with cells and/or the buffers 605 via wirings 606 inside the macro 202. This means that the power source lines 601 and the ground lines 602 function as power supply lines as well as shield lines. Either the power source line 601 or the ground line 602 can serve as the above-described shield line, but both are preferable. If without the power source lines 601 and the ground lines 602, power supply of the buffers 605 can be the same as the wirings to supply powers to the cells inside the macros. No additional power source is needed.

This preferred embodiment of this invention features to set up the internal wiring prohibiting region 301 beforehand on wiring layers inside the macro. For example, the netty internal wiring prohibiting regions 301 are provided on the fifth wiring layer and the sixth wiring layer of the sixth-layered wirings. The buffer allocable regions 302 are secured on the top layer so that repeater buffers can be wired there below the length which was set up beforehand. Here is a description of how to configure the internal wiring prohibiting region 301 and the buffer allocable region 302.

(1) A wiring length between one repeater buffer and another repeater buffer is estimated from the timing conditions and the like.

(2) The internal wiring prohibiting regions 301 are configured with the same interval of the wiring length of the repeater buffers.

(3) In order to ease wiring congestion, the buffer allocable regions 302 (cell configuration prohibiting regions for the macro) are configured along the internal wiring prohibiting regions 301 at a middle portions of intersections of the netty internal wiring prohibiting regions 301.

Figure 8:
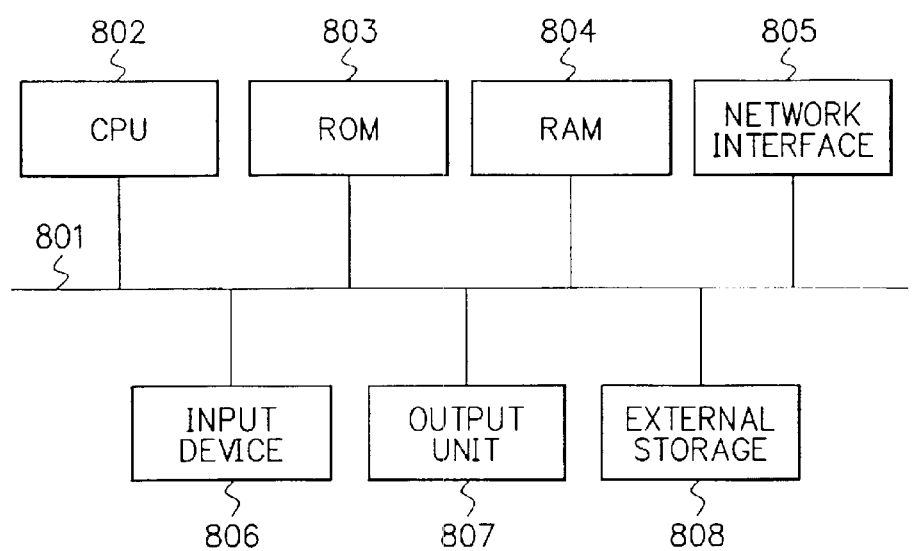
FIG. 8 is a block diagram of a computer hardware intended for CAD in the preferred embodiment of this invention.

FIG. 8 is a block diagram of a computer hardware intended for CAD according to the preferred embodiment. A bus 801 is connected with a central processing unit (CPU) 802, ROM 803, RAM 804, network interface 805, an input device 806, an output unit 807 and an external storage 808.

The CPU 802 not only processes and computes data but also controls the above-described structure units connected via the bus 801. The ROM 803 stores a boot program beforehand therein, and execution of this boot program by the CPU 802 boots this computer. The computer program is stored at the external storage 808, copied at the RAM 804, and executed by the CPU 802. This computer designs a semiconductor circuit by executing the computer program (CAD software).

The external storage 808 is e.g., a hard disk storage, and does not lose data when electric power supply is cut off. The external storage 808 records computer programs and design data in a record medium, and reads them from there.

The network interface 805 inputs and outputs computer programs and design data to and from a network. The input device 806 is e.g., a keyboard, a pointing device (mouse) or the like, and commands such as request or input are possible. The output unit 807 is a display unit, printer or the like.

According to this preferred embodiment of this invention, the macro design is carried out by securing the internal wiring prohibiting regions 301 and the buffer allocable regions 302. Accordingly, the external wirings are wired by passing them through the internal wiring prohibiting regions 301 inside the macro in the case of whole circuit design. The buffers are configured as repeaters connected with these external wirings. In a whole circuit design procedure, the external passing through the macro can be wired. Therefore, a procedure for returning to the macro design can be excluded when modification of a whole circuit design is found impossible, which shortens design time.

Furthermore, layout modification for improving timing on the top layer does not influence as much as timing to another portion, which improves convergence of timing. The macros do not have to be laid out again when changing wiring state on the top layer. When internal wiring prohibiting regions 301 inside the macro is not utilized, it may be a dead space. A layout time can be greatly shortened through slight redundant region. This design method (layout) will be more and more effective with the spread of the high- and large-scale integration and multi-layers in LSI.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described above, because the macro design is carried out by securing the internal wiring prohibiting regions 301 and the buffer allocable regions 302 beforehand, the external wirings can be wired by passing through the internal wiring prohibiting regions 301 inside the macro in the whole circuit design. Furthermore, the buffers can be configured as repeaters for connecting with the external wirings. It excludes a procedure for returning to the macro design when modification of a whole circuit design is found impossible, which shortens design time.

What is claimed is:

1. A method for designing a semiconductor circuit, comprising:
    a macro design step for securing beforehand internal wiring prohibiting regions which enable to wire external wirings vertically and horizontally across a macro, and buffer allocable regions which allocate buffers as repeaters for the external wirings, and for designing plural macros in which plural cells are connected; and
    a whole circuit design step for wiring the external wirings across the macro by passing through the internal wiring prohibiting regions in the macro, and for configuring the buffers as repeaters which are connected with the external wirings inside the buffer allocable regions of the macro when configuring the plural macros and designing the external wirings.

2. The method for designing said semiconductor circuit according to claim 1, wherein,
    the buffer allocable regions are provided at a middle portion of intersections between intersections of vertical internal wiring prohibiting regions and horizontal internal wiring prohibiting regions.

3. The method for designing said semiconductor circuit according to claim 2, wherein
    an interval of the buffer allocable regions is the same as an interval of the intersections between the vertical internal wiring prohibiting regions and the horizontal internal wiring prohibiting regions.

4. The method for designing said semiconductor circuit according to claim 1, wherein
    the buffer allocable regions are provided along the internal wiring prohibiting regions.

5. The method for designing said semiconductor circuit according to claim 1, wherein
    the cells and the buffers inside the macro are connected with a same power source line in said whole circuit design step.

6. The method for designing said semiconductor circuit according to claim 1, wherein
    said whole circuit design step comprises a shield line for shielding between an external wiring passing through the macro and an internal wiring inside the macro.

7. The method for designing said semiconductor circuit according to claim 6, wherein
    the shield line is provided along the external wiring in the internal wiring prohibiting region.

8. The method for designing said semiconductor circuit according to claim 6, wherein
    the shield lines are provided along both sides of the external wiring in the internal wiring prohibiting region.

9. The method for designing said semiconductor circuit according to claim 8, wherein
    the shield line is a power source line or a ground line.

10. The method for designing said semiconductor circuit according to claim 8, wherein
    the shield line is wired as a power source line and a ground line in a parallel state.

11. The method for designing said semiconductor circuit according to claim 10, wherein
    the power source line and the ground line are wired in a parallel state in different wiring layers of said semiconductor circuit.

12. The method for designing said semiconductor circuit according to claim 11, wherein
    the power source line and the ground line are connected with the cells or the buffers.

13. The method for designing said semiconductor circuit according to claim 1, further comprising:
    a macro timing analysis step for analyzing timing of the macro designed in said macro design step; and
    a whole circuit timing analysis step for analyzing timing of the whole circuit designed in said whole circuit design step.

14. A method for designing a semiconductor circuit, comprising:
    a macro design step for securing beforehand internal wiring prohibiting regions which enable to wire external wiring vertically and horizontally across a macro, and buffer allocable regions which allocate buffers as repeaters for the external wirings, and for designing plural macros in which plural cells are connected;
    a macro timing analysis step for analyzing timing of the macro designed in said macro design step;
    a whole circuit design step for configuring the plural macros and designing the external wirings;
    a whole circuit timing analysis step for analyzing timing of a whole circuit designed in said whole circuit design step; and
    a whole circuit modification step for wiring the external wirings across the macro by passing through the internal wiring prohibiting regions of the macros, and for configuring the buffers as repeaters which are connected with the external wirings inside the buffer allocable regions of the macros, when an error is found in the timing analysis of the whole circuit.

15. The method for designing said semiconductor circuit according to claim 14, wherein the buffer allocable regions are provided at a middle portion of intersections between intersections of vertical internal wiring prohibiting regions and horizontal internal wiring prohibiting regions.

16. The method for designing said semiconductor circuit according to claim 14, wherein said whole circuit design step comprises a shield line for shielding between an external wiring passing through the macro and an internal wiring inside the macro.

17. The method for designing said semiconductor circuit according to claim 16, wherein the shield lines are provided along both sides of the external wiring in the internal wiring prohibiting region.

18. The method for designing said semiconductor circuit according to claim 17, wherein the shield line is wired as a power source line and a ground line in a parallel state.

19. The method for designing said semiconductor circuit according to claim 18, wherein the power source line and the ground line are wired in a parallel state in different wiring layers of said semiconductor circuit.

20. The method for designing said semiconductor circuit according to claim 19, wherein the power source line and the ground line are connected with the cells and the buffers.

* * * * *